United States Patent

Figura et al.

Patent Number: 5,837,596
Date of Patent: *Nov. 17, 1998

[54] FIELD OXIDE FORMATION BY OXIDATION OF POLYSILICON LAYER

[75] Inventors: Thomas A. Figura; Nanseng Jeng, both of Boise, Id.

[73] Assignee: Micron Technology, Inc., Boise, Id.

[*] Notice: The term of this patent shall not extend beyond the expiration date of Pat. No. 5,438,016.

[21] Appl. No.: 408,411

[22] Filed: Mar. 20, 1995

Related U.S. Application Data

[63] Continuation of Ser. No. 205,663, Mar. 2, 1994, Pat. No. 5,438,016.

[51] Int. Cl.$^6$ .................................................. H01L 21/76
[52] U.S. Cl. .......................................................... 438/446
[58] Field of Search ............................... 437/69, 968, 70, 437/72; 148/DIG. 117; 438/446

[56] References Cited

U.S. PATENT DOCUMENTS

| | | |
|---|---|---|
| 4,376,336 | 3/1983 | Endo et al. . |
| 4,541,167 | 9/1985 | Havemann ................................ 576/29 |
| 4,868,136 | 9/1989 | Ravaglia .................................. 437/38 |
| 4,892,614 | 1/1990 | Chapman et al. ......................... 437/67 |
| 4,980,311 | 12/1990 | Namose .................................... 437/72 |
| 5,087,586 | 2/1992 | Chan et al. ............................... 437/72 |
| 5,116,779 | 5/1992 | Iguchi . |
| 5,130,268 | 7/1992 | Liou et al. . |
| 5,326,715 | 7/1994 | Jang et al. . |
| 5,342,480 | 8/1994 | Nisihzawa et al. ....................... 437/67 |
| 5,346,584 | 9/1994 | Nasr et al. . |
| 5,382,541 | 1/1995 | Bajor et al. .............................. 437/67 |
| 5,459,100 | 10/1995 | Choi . |
| 5,472,904 | 12/1995 | Figura et al. . |
| 5,498,566 | 3/1996 | Lee . |

FOREIGN PATENT DOCUMENTS

| | | | |
|---|---|---|---|
| 59-11645 | 1/1984 | Japan ........................................ 437/72 |
| 00-22342 | 2/1984 | Japan ........................................ 437/70 |
| 0121737 | 6/1985 | Japan ........................................ 437/67 |
| 61-81649 | 4/1986 | Japan ........................................ 437/69 |

(List continued on next page.)

OTHER PUBLICATIONS

Park T., et al, "A Novel Locus–type . . . Thinning Effect", Ext. Abs. 1993 Int'l Conf. on Solid State Devices & Mat. pp. 528–530.

Ghandi, "VSLI Fabrication Principles", 1983, pp. 479–482 and pp. 495–497.

Toshiyuki Nashihara et al., "A 0.5um Isolation Technology Using Advanced Poly Silicon Pad LOCUS (APPL)", *IEEE*, 1988, pp. 100–103.

H.S. Yang et al., "Poly Void Formation in Poly Buffer LOCUS Process", Extended Abstracts of the Spring Electrochemical Society Meeting, 1992, p. 442.

(List continued on next page.)

*Primary Examiner*—George R. Fourson

[57] ABSTRACT

A process for forming field oxide on a semiconductor substrate having reduced field oxide thinning comprises forming of an oxide layer over a semiconductor substrate, and forming a protective layer over the oxide layer. A mask is formed over the protective layer thereby forming exposed and covered regions of the protective layer. The exposed portions of the protective layer are removed to form at least first, second, and third disconnected protective structures, wherein the distance between the first and second protective structures is smaller than the distance between the second and third protective structures. The oxide layer and a portion of the substrate between the protective structures is removed to expose a portion of the substrate. A blanket polycrystalline silicon (poly) layer is formed over the substrate, and the poly layer is isotropically etched to remove the poly from between the second and third protective structures and leave a portion of the poly between the first and second structures. The poly between the first and second protective structures is oxidized to form regions of field oxide having a substantially uniform thickness across the substrate. The oxidation between the first and second protective structures can also include substrate oxidation once the poly is consumed.

24 Claims, 2 Drawing Sheets

FOREIGN PATENT DOCUMENTS

| | | | |
|---|---|---|---|
| 61-228650 | 10/1986 | Japan | 437/72 |
| 0256649 | 11/1986 | Japan | 437/67 |
| 63-87741 | 4/1988 | Japan | 437/69 |
| 63-137457 | 6/1988 | Japan | 437/70 |
| 63-155747 | 6/1988 | Japan | 437/70 |
| 1151244 | 6/1989 | Japan . | |
| 2-260639 | 10/1990 | Japan | 437/70 |
| 0034556 | 2/1991 | Japan | 437/67 |
| 0218049 | 9/1991 | Japan | 437/67 |
| 513566 | 1/1993 | Japan | 437/72 |

OTHER PUBLICATIONS

J.M. Sung, "The Impact of Poly–Removal Techiques on Thin Thermal Oxide Property in Poly–Buffered LOCUS Technology", *IEEE Transactions on Electron Devices,* Aug. 1991, pp. 1990–1973.

Stanley Wolf, "A Review of IC Isolation Technologies— Part 6", *Solid State Technology,* Dec. 1992, pp. 39–41.

R.L. Guldi, "Characterization of Poly–Buffered LOCUS in Manufacturing Environment", *J. Electrochem. Soc.,* Dec. 1989, pp. 3815–3820.

Tin–Hwang Lin, "Twin–White–Ribbon Effect and Pit Formation Mechanism in PBLOCOS", *J. Electrochem. Soc.,* Jul. 1991, pp. 2145–2149.

M. Ghezzo, "LOPOS: Advanced Device Isolation for a 0.8um CMOS/BULK Process Technology", *Journal of th Electrochemical Society,* Jul. 1989, pp. 1992–1996.

N. Shimizu et al., "A Poly–Buffere Recessed LOCOS Process for 256Mbit DRAM Cells", *IEEE,* IEDM 92–279, pp. 10.6.1–10.6.4, 1992.

Park et al., "Novel LOCUS–Type Isolation Technology Free of the Field Oxide Thinning Effect", Extended Abstacts of the 1993 International Conference of Solid State Devices and Materials, Makuhari, 1993, pp. 528–530.

IBM Technical Disclosure Bulletin, vol. 29, No. 2, Jul. 1986.

FIELD OXIDE FORMATION BY OXIDATION OF POLYSILICON LAYER

This is a continuation of application Ser. No. 08/205,663, filed Mar. 2, 1994, now U.S. Pat. No. 5,438,016.

This invention was made with Government support under Contract No. MDA 972-93-C-0033 awarded by Advanced Research Projects Agency ("ARPA"). The Government has certain rights in this invention.

FIELD OF THE INVENTION

This invention relates to the field of semiconductor manufacture, and more particularly to the formation of a thick oxide layer.

BACKGROUND OF THE INVENTION

Many types of semiconductor devices such as dynamic random access memories (DRAMs), static rams (SRAMs), and programmable read-only memories (PROMs) are formed in much the same way. Layers of oxide, nitride, and polycrystalline silicon (polysilicon or poly) are formed over a substrate such as monocrystalline silicon or gallium arsenide to form field and gate oxide, capacitor cell plates, word and digit lines, and various other structures.

To form a thick oxide layer 10 such as field oxide shown in FIG. 1, a thin blanket oxide layer 12 is formed over a substrate 14. A blanket layer of protective material such as nitride 16A–16D is formed over the oxide layer 12, and a patterned mask (not shown) is formed over the protective layer to cover regions of protective material and leaving other regions of protective material exposed. The exposed protective regions (and often the underlying oxide layer) is etched to expose the underlying oxide layer (or underlying substrate). The substrate is then oxidized to form the field oxide as shown in FIG. 1.

Depending on the design of the device being formed, the field oxide can often require varying distances between an adjacent field oxide. To form the field oxide, the protective structures formed have varying distances between them as shown in FIG. 1. The distance between protective structure 16A and protective structure 16B, for example, is smaller than the distance between protective structure 16B and protective structure 16C. One problem which can result from differing distances between protective structures is field oxide thinning. When the substrate is oxidized, the smaller distance between protective structures results in a thinner field oxide than in regions that have a larger distance between protective structures, such as shown in FIG. 1. This can result in a device that has less desirable electrical characteristics than a device in which the field oxide thickness is uniform across the substrate. A process for reducing field oxide thinning would be desirable.

SUMMARY OF THE INVENTION

A process for forming a semiconductor device comprises the steps of forming a first oxide layer over a semiconductor substrate, a protective layer over the first oxide layer, and a patterned mask over the protective layer thereby forming exposed and covered portions of the protective layer. Next, the exposed portions of the protective layer are removed to form at least first, second, and third disconnected protective structures such that a first distance between the first and second protective structures is smaller than a second distance between the second and third protective structures. The oxide layer underlying the exposed protective structures is also removed along with a portion of the substrate underlying the exposed protective structures. This exposes a portion of the substrate.

A second oxide layer is then formed over the exposed portions of the substrate, and a blanket polycrystalline silicon layer is formed over the substrate. The polycrystalline silicon layer is etched to remove the polycrystalline silicon from between the second and third protective structures and leaving a portion of the polycrystalline silicon between the first and second protective structures.

Finally, the polycrystalline silicon layer between the first and second protective structures is oxidized to form of field oxide.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
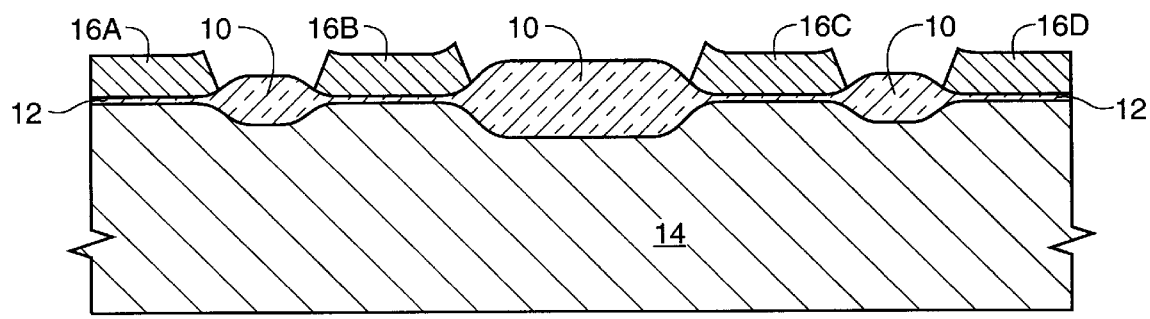
FIG. 1 is a cross-section of a conventionally formed structure having field oxide thinning.
Figure 2:
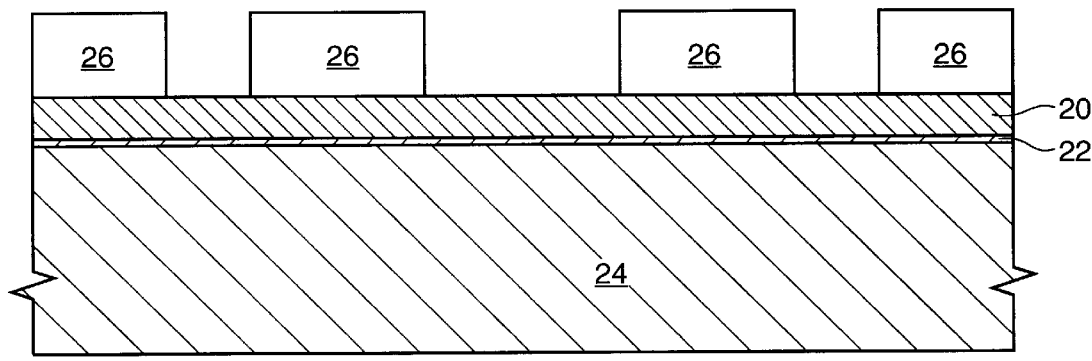
FIG. 2 shows a cross-section of a first step in one embodiment of the inventive process.

FIGS. 2–5 show one embodiment of the inventive process. In FIG. 2, a protective layer 20 is formed over a thin first oxide layer 22, which is formed over a semiconductor substrate 24 such as silicon or gallium arsenide. The protective layer 20 can comprise nitride and oxide, or any material which prevents the underlying material from oxidizing. In any case, a patterned mask 26 is formed over the protective layer 20 thereby forming exposed and covered portions of the protective layer. An anisotropic (vertical) etch is performed, which removes the exposed portions of the protective layer. This forms at least first 30A, second 30B, and third 30C disconnected protective structures (a forth, 30D, is also shown) such that a first distance between first 30A and second 30B protective structures is smaller than a second distance between the second 30B and third 30C protective structures. The first oxide 22 and a portion of the substrate 24 underlying the exposed protective structures are also removed, thereby exposing a portion of the substrate 24. Between about 200 angstroms (Å) to 2000 Å of substrate can be removed. Subsequent to the etch, a second oxide layer 32 is formed over the exposed substrate, for example by oxidizing the exposed substrate 24. A second oxide layer (shown in FIG. 3) of from about 100 Å to about 1000 Å thick is sufficient although other thickness may also function adequately. In an alternate embodiment, this oxide layer 32 can be omitted.

Figure 3:
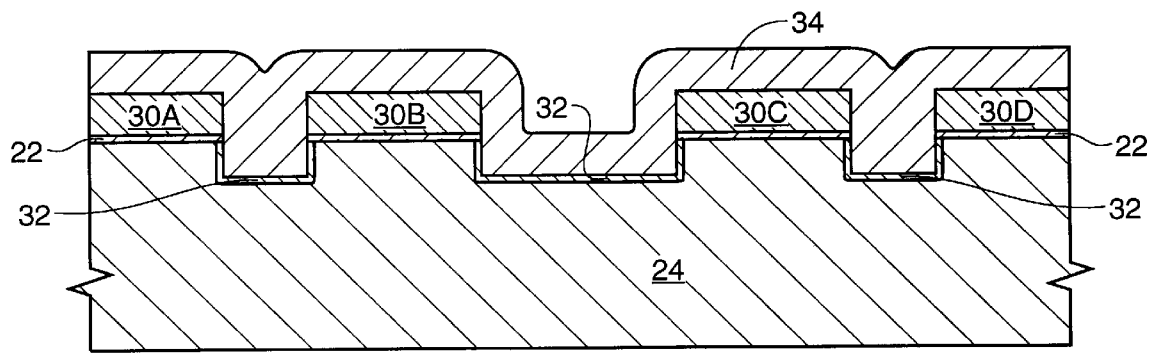
FIG. 3 shows the FIG. 2 structure after an etch, a oxidation, and formation of a polycrystalline silicon (poly) layer.

Whether or not the second oxide layer 32 is formed, a blanket polycrystalline silicon (poly) layer 34 is formed over the substrate 24 as shown in FIG. 3. The thickness of the poly layer can vary depending on the distance between the protective structures. The poly layer should be formed thick enough to impinge on itself and bridge in the narrowest distances between the protective structures as shown, in FIG. 3 but not completely fill in the wider distances between the protective structures. This effectively results in a thicker poly layer over the substrate in the narrow regions (between 30A and 30B, for example) and a thinner poly layer over the substrate in the wide regions (between 30B and 30C). A poly layer deposited at least half as thick as the narrow distance is wide would sufficiently bridge the narrow distance.

Figure 4:
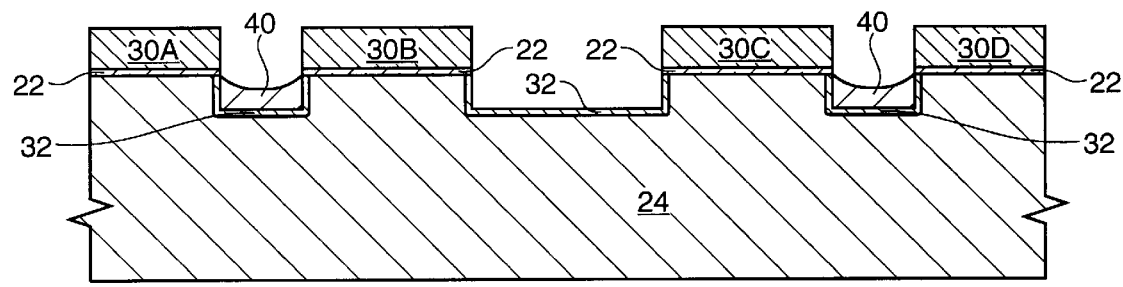
FIG. 4 shows the FIG. 3 structure after the poly layer is etched.

Next, an isotropic etch of the poly layer 34 is performed using the second oxide layer 32 as an etch stop, and the results are shown in FIG. 4. If the second oxide layer is not formed, the etch can be timed to remove only the desired material. In either case, etch removes the poly from between the widely-spaced protective structures (the poly between 30B and 30C), but leaves a portion of the poly between the narrowly-spaced protective structures (the poly between 30A and 30B). The thickness of the poly layer depends on the amount of field oxide thinning that is to be overcome, and can be determined by one of skill in the art. In general, more severe field oxide thinning requires a thicker poly layer in the narrow regions.

Figure 5:
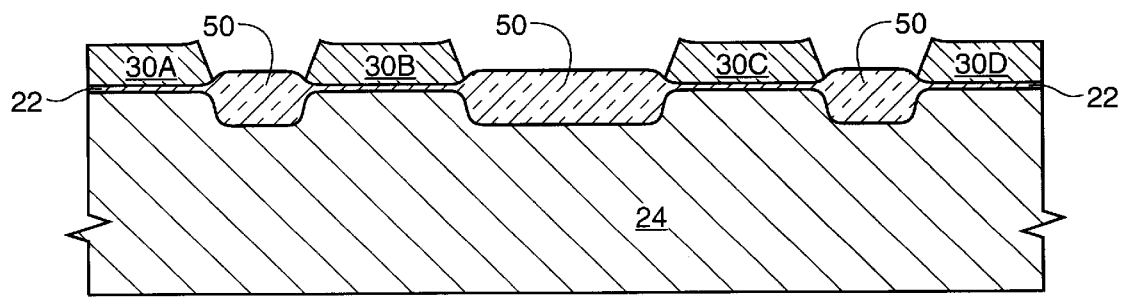
FIG. 5 shows the FIG. 4 structure after formation of the field oxide.

Finally, the poly between the first and second protective structures is oxidized to form field oxide 50 as shown in FIG. 5. The polycrystalline silicon (doped or undoped) oxidizes at a faster rate than the second oxide layer, and thus forms a thicker oxide than the second oxide layer. The more rapid oxidation of the poly layer offsets the field oxide thinning in the narrow regions, and thus the thickness of the field oxide across the substrate is substantially uniform. For example, with field oxide having a target thickness of 4000 Å, the process easily can be optimized by one of skill in the art from the description herein so the field oxide in the narrow areas and the wide regions can fall between 3800 Å and 4200 Å. The oxidation between the first and second protective structures can also include substrate oxidation once the poly is consumed.

The oxidation time required to form a sufficient field oxide layer may be reduced with the inventive process over conventional processes. In addition to forming a more uniform field oxide layer across the substrate, encroachment of the oxide under the protective structures may be decreased due to the reduced oxidation time.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising the following steps:
   providing a first layer having first and second trenches therein, said first trench having a narrower width than said second trench;
   forming an oxidizable layer in said first trench, said second trench being free from said oxidizable layer;
   oxidizing said oxidizable layer in said first trench; and
   oxidizing said first layer at said second trench.

2. The method of claim 1 wherein said oxidizable layer oxidizes at a faster rate than said first layer.

3. The method of claim 1 wherein said first layer is a semiconductor wafer.

4. The method of claim 1 wherein oxidizing said oxidizable layer and said first layer forms field oxide.

5. The method of claim 4 wherein said field oxide at said first and second trenches has about the same thickness.

6. A method used during the formation of field oxide comprising the following steps:
   forming a protective layer over a substrate;
   etching said protective layer and said substrate to form first and second trenches in said substrate, said first trench having a narrower width than said second trench;
   forming an oxidizable layer in said first and second trenches;
   removing said oxidizable layer from said second trench and leaving at least a portion of said oxidizable layer in said first trench; and
   subsequent to removing said oxidizable layer from said second trench, oxidizing said oxidizable layer which remains in said first trench and oxidizing said substrate at said second trench.

7. The method of claim 6 wherein said oxidizable layer is polycrystalline silicon.

8. A method used during the formation of a semiconductor device comprising the following steps:
   providing a first layer having first and second trenches therein, wherein a width of said first trench is narrower than a width of said second trench;
   forming an oxidizable layer within said first and second trenches such that said oxidizable layer impinges on itself to bridge across said first trench but said oxidizable layer within said second trench does not impinge on itself;
   etching said oxidizable layer to leave at least a portion of said oxidizable layer in said first trench and to remove all of said oxidizable layer from said second trench; and
   oxidizing said oxidizable layer in said first trench and oxidizing said first layer at said second trench.

9. The method of claim 8 wherein said oxidizable layer is polycrystalline silicon.

10. The method of claim 8 wherein said oxidizable layer oxidizes at a faster rate than said first layer.

11. The method of claim 8 wherein said etch is an isotropic etch.

12. The method of claim 8 further comprising the following steps:
    forming an oxide layer over said first layer prior to said step of forming said oxidizable layer; and
    subsequent to forming said oxide layer over said first layer, forming said oxidizable layer over said oxide layer.

13. The method of claim 12 wherein said oxide layer formed prior to said step of forming said oxidizable layer functions as an etch stop during said step of etching said oxidizable layer.

14. The method of claim 8 wherein oxidizing said oxidizable layer and said first layer forms field oxide.

15. The method of claim 8 wherein said oxidizable layer in said second trench is at least half as thick as said width of said first trench after said step of forming said oxidizable layer.

16. A method used during the formation of a semiconductor device comprising the following steps:
    providing a silicon substrate having first and second trenches therein, wherein a width of said first trench is narrower than a width of said second trench;

forming a polycrystalline silicon layer within said first and second trenches such that said polycrystalline silicon layer bridges across said first trench but does not bridge across said second trench;

isotropically etching said polycrystalline silicon layer to leave at least a portion of said polycrystalline silicon layer in said first trench and to remove all of said polycrystalline silicon layer from said second trench; and oxidizing said polycrystalline silicon layer in said first trench and oxidizing said silicon substrate at said second trench wherein said polycrystalline silicon layer oxidizes faster than said silicon substrate.

17. The method of claim 16 further comprising the following steps:

forming an oxide layer over said silicon substrate prior to said step of forming said polycrystalline silicon layer; and subsequent to forming said oxide layer over said silicon substrate, forming said polycrystalline silicon layer over said oxide layer.

18. The method of claim 17 wherein said oxide layer formed prior to said step of forming said polycrystalline silicon layer functions as an etch stop during said step of etching said polycrystalline silicon layer.

19. The method of claim 16 wherein oxidizing said polycrystalline silicon layer and said silicon substrate forms field oxide.

20. The method of claim 16 wherein said polycrystalline silicon layer is formed at least half as thick as said width of said first trench.

21. A method used during the formation of a semiconductor device comprising the following steps:

providing a first layer having first and second trenches therein, said first trench having a narrower width than said second trench;

providing an oxidizable layer in said first trench to cover said first layer at said first trench while, simultaneously, said second trench consists essentially of exposed said first layer; and oxidizing said oxidizable layer in said first trench while simultaneously oxidizing said first layer at said second trench.

22. The method of claim 21 wherein said step of providing said oxidizable layer comprises the steps of:

forming said oxidizable layer in said first and second trenches;

removing said oxidizable layer from said second trench such that said second trench consists essentially of exposed said first layer.

23. The method of claim 22 wherein said first layer comprises a layer of oxide over a silicon substrate, and said oxide layer is exposed in said trench during said step of providing said oxidizable layer.

24. The method of claim 22 wherein said first layer comprises a silicon substrate, and said silicon substrate is exposed in said trench during said step of providing said oxidizable layer.

* * * * *